United States Patent
Hazama et al.

(10) Patent No.: US 10,229,742 B2
(45) Date of Patent: Mar. 12, 2019

(54) FLASH MEMORY DEVICE

(71) Applicant: Hitachi, Ltd., Tokyo (JP)

(72) Inventors: Yohei Hazama, Tokyo (JP); Junji Ogawa, Tokyo (JP); Kenta Ninose, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/556,680

(22) PCT Filed: Jun. 19, 2015

(86) PCT No.: PCT/JP2015/067685
§ 371 (c)(1),
(2) Date: Sep. 8, 2017

(87) PCT Pub. No.: WO2016/203631
PCT Pub. Date: Dec. 22, 2016

(65) Prior Publication Data
US 2018/0061498 A1 Mar. 1, 2018

(51) Int. Cl.
| | | |
|---|---|---|
| G11C 16/10 | (2006.01) | |
| G11C 16/26 | (2006.01) | |
| G06F 12/16 | (2006.01) | |
| G06F 3/06 | (2006.01) | |
| G06F 11/10 | (2006.01) | |
| G11C 11/56 | (2006.01) | |
| G11C 16/34 | (2006.01) | |

(52) U.S. Cl.
CPC ............. *G11C 16/26* (2013.01); *G06F 3/067* (2013.01); *G06F 3/0688* (2013.01); *G06F 11/1048* (2013.01); *G06F 11/1068* (2013.01); *G06F 11/1076* (2013.01); *G06F 12/16* (2013.01); *G11C 11/5642* (2013.01); *G11C 16/349* (2013.01); *G11C 2211/5648* (2013.01)

(58) Field of Classification Search
CPC ............................ G11C 16/0483; G11C 16/10
USPC ........................................ 365/185.09, 185.24
See application file for complete search history.

(56) References Cited

U.S. PATENT DOCUMENTS

| | | | |
|---|---|---|---|
| 9,021,336 B1 * | 4/2015 | Northcott ............ | G06F 11/1068 714/752 |
| 9,176,812 B1 * | 11/2015 | Northcott ............ | G06F 11/1068 |
| 9,575,125 B1 * | 2/2017 | Andre .................... | G11C 29/10 |
| 2004/0153902 A1 * | 8/2004 | Machado ............ | G06F 11/1068 714/710 |

(Continued)

FOREIGN PATENT DOCUMENTS

| | | |
|---|---|---|
| JP | 2011-100519 A | 5/2011 |
| JP | 2012-221522 A | 11/2012 |

OTHER PUBLICATIONS

International Search Report of PCT/JP2015/067685 dated Aug. 25, 2015.

(Continued)

*Primary Examiner* — Michael Tran
(74) *Attorney, Agent, or Firm* — Mattingly & Malur, PC

(57) ABSTRACT

A flash memory controller is configured to hold a read pattern defining an order of selection of read options specifying a parameter value for a read from the flash memory chip. The flash memory controller is configured to execute error correction on data read from the flash memory chip in accordance with the read command. The flash memory controller is configured to designate a next read option specified in the read pattern to read the data from the flash memory chip in a case where all errors in the read data are not corrected by the error correction.

15 Claims, 18 Drawing Sheets

| WEAR DEGREE – READ PATTERN CORRESPONDENCE TABLE | 270 |
|---|---|
| WEAR DEGREE | READ PATTERN |
| 0 | 0 |
| 100 | 0 |
| 200 | 0 |
| 300 | 0 |
| 400 | 1 |
| ⋮ | ⋮ |
| 5000 | 5 |
| 5100 | 5 |
| ⋮ | ⋮ |
| 10000 | 7 |
| ⋮ | ⋮ |

(56) References Cited

U.S. PATENT DOCUMENTS

| | | | |
|---|---|---|---|
| 2004/0187050 A1* | 9/2004 | Baumann | G01R 31/2881 |
| | | | 714/704 |
| 2010/0211852 A1 | 8/2010 | Lee et al. | |
| 2011/0093765 A1* | 4/2011 | Lee | G06F 11/1072 |
| | | | 714/773 |
| 2012/0257453 A1 | 10/2012 | Shino et al. | |
| 2012/0268994 A1* | 10/2012 | Nagashima | G06F 11/1048 |
| | | | 365/185.11 |
| 2013/0132652 A1* | 5/2013 | Wood | G06F 12/0246 |
| | | | 711/103 |
| 2013/0185611 A1* | 7/2013 | Goettfert | G06F 11/1008 |
| | | | 714/766 |
| 2013/0238836 A1 | 9/2013 | Suzuki et al. | |
| 2016/0180945 A1* | 6/2016 | Ng | G11C 11/5628 |
| | | | 365/185.03 |
| 2016/0188206 A1* | 6/2016 | Sinclair | G06F 3/061 |
| | | | 711/103 |
| 2016/0252562 A1* | 9/2016 | Biswas | G01R 33/00 |
| | | | 324/764.01 |
| 2017/0132000 A1* | 5/2017 | Voigt | G06F 8/65 |
| 2017/0185343 A1* | 6/2017 | Ray | G06F 11/108 |

OTHER PUBLICATIONS

Written Opinion of the International Searching Authority; International Application No. PCT/JP2015/067685 dated Aug. 25, 2015.

* cited by examiner

WEAR DEGREE MANAGEMENT TABLE 230

| CHIP NUMBER | BLOCK NUMBER | ACCUMULATED ERASE COUNT | WRITE DATE AND TIME | NUMBER OF ECC-CORRECTED BITS | READ OPTION | RETRY READ USE RATE | FM TEMPERATURE | NUMBER OF UNUSABLE BLOCKS IN CHIP | READ PATTERN TO BE USED |
|---|---|---|---|---|---|---|---|---|---|
| 0 | 0 | 1036 | 15/01/21 08:00 | 8 | 0 | 0.0001 | 58 |  | 0 |
| 0 | 1 | 1230 | 15/01/29 19:51 | 3 | 4 | 0.0010 | 58 | 8 | 2 |
| 0 | 2 | 972 | 15/02/03 14:02 | 14 | 3 | 0.0003 | 57 |  | 4 |
| ... | ... | ... | ... | ... | ... | ... | ... | ... | ... |
| 255 | 2046 | 1385 | 15/01/31 01:30 | 10 | 0 | 0.0000 | 59 |  | 3 |
| 255 | 2047 | 1194 | 15/02/15 23:43 | 6 | 0 | 0.0002 | 55 | 3 | 5 |
| ... | ... | ... | ... | ... | ... | ... | ... | ... | 1 |
| ... | ... | ... | ... | ... | ... | ... | ... | ... | ... |

Fig. 3

| READ PATTERN CONFIGURATION TABLE 250 |||||
|---|---|---|---|---|
| READ PATTERN : 0 || ... | READ PATTERN : 19 ||
| ORDER OF READ | READ OPTION | ... | ORDER OF READ | READ OPTION |
| 1 | 0 | | 1 | 7 |
| 2 | 1 | | 2 | 6 |
| 3 | 2 | | 3 | 5 |
| 4 | 3 | | 4 | 4 |
| 5 | 4 | | 5 | 3 |
| 6 | 5 | ... | 6 | 2 |
| 7 | 6 | | 7 | 1 |
| ⋮ | ⋮ | | ⋮ | ⋮ |

*Fig.4*

| WEAR DEGREE – READ PATTERN CORRESPONDENCE TABLE 270 ||
|---|---|
| WEAR DEGREE | READ PATTERN |
| 0 | 0 |
| 100 | 0 |
| 200 | 0 |
| 300 | 0 |
| 400 | 1 |
| ⋮ | ⋮ |
| 5000 | 5 |
| 5100 | 5 |
| ⋮ | ⋮ |
| 10000 | 7 |
| ⋮ | ⋮ |

*Fig.6*

| READ PATTERN MANAGEMENT TABLE 290 ||
|---|---|
| READ PATTERN REGISTER | REGISTERED READ PATTERN |
| 0 | 1 |
| 1 | 4 |
| 2 | 3 |
| 3 | 11 |
| 4 | 12 |
| 5 | 13 |
| 6 | 14 |
| 7 | 15 |

*Fig.7*

FLASH MEMORY DEVICE

BACKGROUND

This invention relates to a flash memory device.

In recent years, flash memory devices have become common that employs flash memories allowing high-speed read/write as storage media. Advancement in miniaturization of flash memories lowers the prices of flash memory devices but increases the error rate of the stored data. For this reason, the flash memory devices need to perform data recovery with an error correction function. However, data retrieved in a single read may include errors more than the limit of correction, depending on the condition of the flash memory chip.

To increase the reliability, flash memory devices have a read retry function that re-reads data with a parameter different from the one used in the previous read. The read retry function can raise the possibility to read data successfully by reducing the errors in the data in a single read to less than the limit of correction. For example, US 2013/0238836 A discloses that a processor searches for an appropriate read parameter and instructs a flash memory interface to transfer the read parameter.

Patent Literature 1: US 2013/0238836 A

SUMMARY

The configuration that the processor receives the result of a read retry and further issues an instruction to retry the read with a different read parameter causes large overhead on the processor, requiring long time for the read retries.

The flash memory has a restriction that reading/writing data should be performed on a page-by-page basis. When page data retrieved from a given page in a flash memory chip includes an uncorrectable error, the page data is uncorrectable and the flash memory device cannot recover the data by itself. Accordingly, it takes more time for a RAID (Redundant Arrays of Independent Disks) function to recover the data using data in other flash memory devices. Such taking time for error correction impairs the high-speed performance of the flash memory.

A representative example of this invention is a flash memory device including a flash memory chip configured to store data, a processor configured to interpret a read request from an external and create a read command, and a flash memory controller configured to receive the read command from the processor, wherein the flash memory controller is configured to hold a read pattern defining an order of selection of read options specifying a parameter value for a read from the flash memory chip, execute error correction on data read from the flash memory chip in accordance with the read command, and designate a next read option specified in the read pattern to read the data from the flash memory chip in a case where all errors in the read data are not corrected by the error correction.

An aspect of this invention achieves high-speed read in a flash memory device.

BRIEF DESCRIPTION OF THE DRAWINGS

FIG. 3 illustrates a configuration example of a wear degree management table;

FIG. 4 illustrates a configuration example of a read pattern configuration table;

FIG. 6 illustrates a configuration example of a wear degree-read pattern correspondence table;

FIG. 7 illustrates a configuration example of a read pattern management table;

DETAILED DESCRIPTION OF THE EMBODIMENTS

Figure 1:
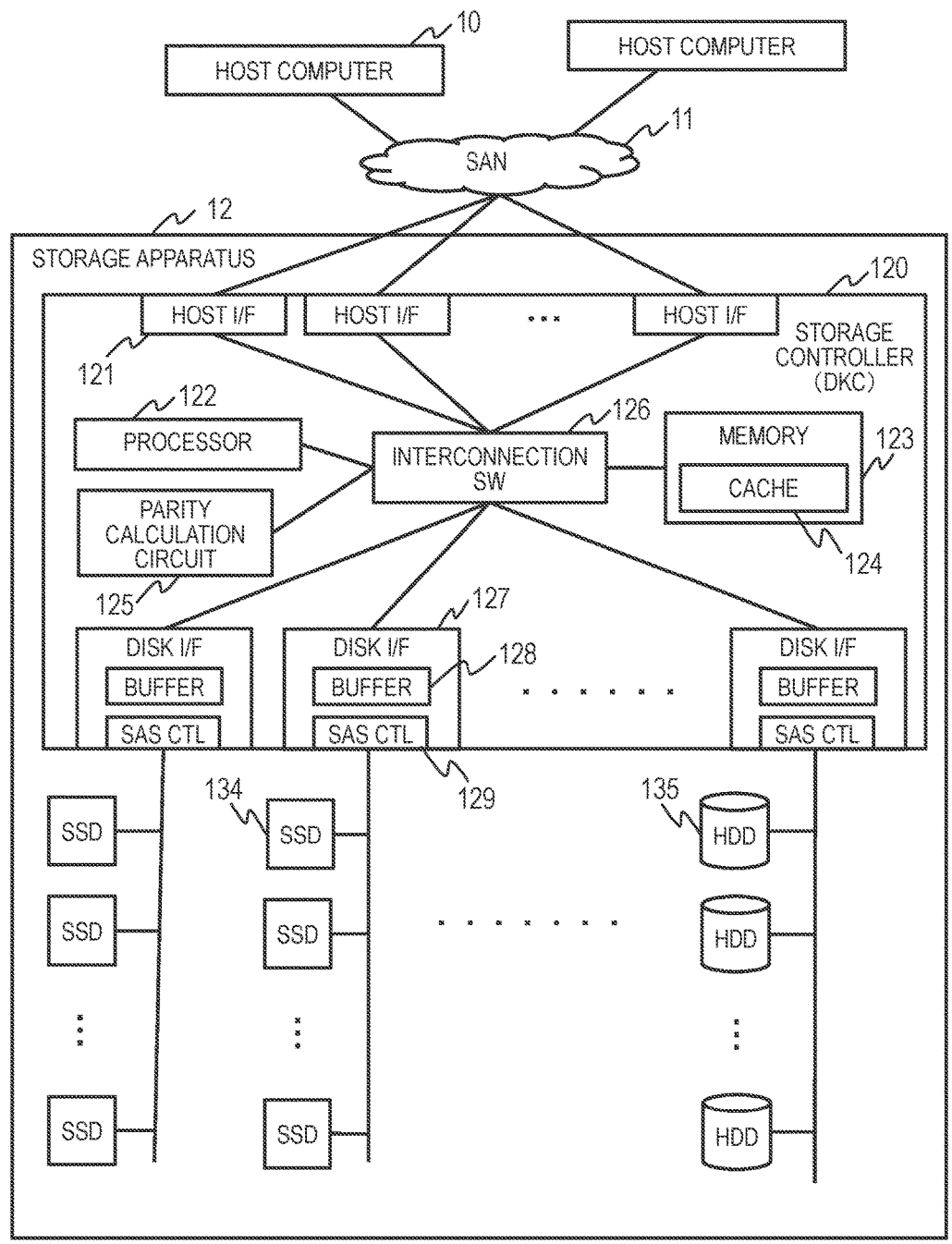
FIG. 1 schematically illustrates a general configuration of a computer system.

Hereinafter, an embodiment of this invention will be described with reference to the accompanying drawings. It should be noted that the embodiment is merely an example to implement this invention and is not to limit the technical scope of this invention. Throughout the drawings, common elements are denoted by the same reference signs unless otherwise specified.

In the following, a flash memory device including flash memory chips and a storage apparatus including the flash memory device are disclosed. The flash memory device includes a processor and a flash memory controller. The processor analyzes a read request from a host apparatus to create a read command and issues the read command to the flash memory controller.

The flash memory controller reads data from a flash memory chip in accordance with the read command. The flash memory controller instructs the flash memory chip to read the data with designation of a read option and a physical area to be accessed. The flash memory chip reads the data using the read parameters specified by the read option.

The flash memory controller holds a read pattern specifying the order of selection of read options. The flash memory controller instructs the flash memory chip to execute a read with designation of a read option in accordance with the read pattern. If the data retrieved in the one read is all correctable, the read is completed. Holding the read pattern in the flash memory controller leads to reduction in number of times of intervention (overhead) of the processor in read retries, which expedites completion of the read.

In an example, the flash memory controller holds a plurality of read patterns and the processor designates a read pattern suitable for the condition of the area to be accessed. The flash memory controller executes read retries with different read options in accordance with the designated read pattern. This configuration achieves a smaller number of read retries to expedite completion of the read.

In an example, the flash memory device recovers data by error correction unit (code word) and further, manages the data and error correction success or failure information by code word. The flash memory chip reads data in units of page and a page includes a plurality of code words. A code word is composed of user data and an error correction code. The flash memory device recovers data code word by code word and merges the data recovered in multiple reads. This configuration increases the possibility of successful data recovery and further, reduces the number of read retries.

The example described hereinafter executes both of the read retries in accordance with a read pattern and the merge of user data in code words; however, the flash memory device may be implemented with only either one of the functions. The flash memory controller in the example described hereinafter holds a plurality of read patterns, but the flash memory controller can hold only one read pattern. In such a case, the processor can omit designation of a read pattern.

FIG. 1 schematically illustrates a general configuration of a computer system in this embodiment. In FIG. 1, reference signs for elements having the same configuration are omitted. The computer system includes host computers 10 and a storage apparatus 12. The host computers 10 and the storage apparatus 12 are connected by a data network 11. Each host computer 10 is an apparatus that accesses the resources of the storage apparatus 12 to perform tasks.

The data network 11 is a network for data communication and can be a storage area network (SAN), for example. The data network 11 may be a network different from a SAN, as far as it is a network for data communication.

The storage apparatus 12 includes storage devices 134 and 135, and a storage controller 120. In this example, the storage apparatus 12 includes two types of storage devices: specifically, solid state drives (SSDs) 134 and hard disk drives (HDDs) 135. The storage controller 120 is a host device of the storage devices.

The storage controller 120 includes a processor 122, a memory 123, a parity calculation circuit 125, a plurality of disk interfaces (I/F) 127, and a plurality of host interfaces (I/F) 121. These are connected by an interconnection switch (SW) 126 to be able to communicate with one another.

The host interfaces 121 have a function to connect to the data network 11 and convert the protocol used in the communication in the network 11 to the protocol used within the storage controller 120.

The processor 122 executes a storage control program and other necessary programs stored in the memory 123 to implement predetermined functions, inclusive of control of I/O accesses (reads/writes) from the host computers 10 and management and control of the volumes of the storage apparatus 12.

The memory 123 stores programs to be executed by the processor 122 and control data therefor. The memory 123 further stores user data (host data) of the host computers 10 to a cache area 124 on a temporary basis. Specifically, the cache area 124 temporarily stores write data from a host computer 10 and then transfers the data to a storage device 134 or 135, and also temporarily stores read data to be transferred from a storage device 134 or 135 to a host computer 10.

The parity calculation circuit 125 generates parity data for RAID functionality from the host data from the host computers 10. The group of the storage devices 134 and the group of the storage devices 135 are each configured to have redundancy (called RAID configuration); the generated parity data is stored to a storage device together with host data. The parity calculation circuit 125 recovers host data that is not read correctly from a storage device using the parity data.

Each disk interface 127 connects to a group of the same type of storage devices and mediates write data and read data between the storage device group and the cache area 124. The disk interface 127 converts the communication protocol used in the storage devices 134 or 135 to the communication protocol used in the storage controller 120, and vice versa. The protocol of the storage devices 134 or 135 depends on the design.

Each disk interface 127 includes a buffer 128 and a serial attached SCSI (SAS) controller (CTL) 129. The buffer 128 temporarily stores write data to be written to a storage device and read data retrieved from a storage device. The SAS controller 129 communicates with the storage devices 134 or 135 using SAS protocol.

Figure 2A:
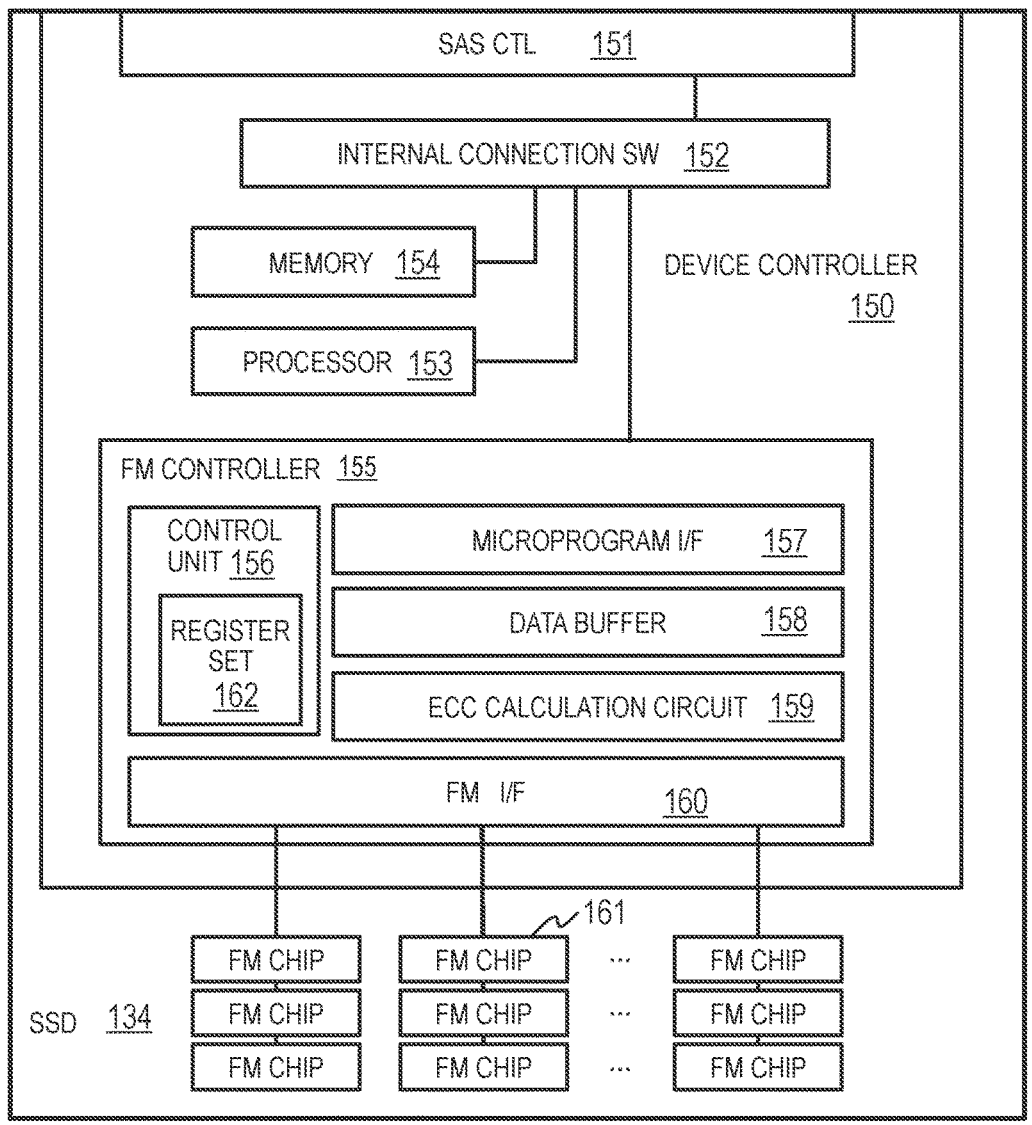
FIG. 2A illustrates a configuration example of an SSD.

FIG. 2A illustrates a configuration example of an SSD 134. The SSD 134 is a flash memory device that uses a flash memory (FM) as a storage medium. In the example of FIG. 2A, the SSD 134 includes a device controller 150 and a plurality of flash memory chips 161.

As to a flash memory, data is read or written in units of page. Data is written to a data-erased page. Data in the flash memory is erased in units of block. A block consists of a plurality of pages. The flash memory is characterized by not allowing overwrite of data. To overwrite data in a page, the device controller 150 writes data to a page different from the original page and updates the mapping of the logical addresses to the physical addresses.

The device controller 150 includes a SAS controller (SAS CTL) 151, a processor 153, a memory 154, and a flash memory (FM) controller 155. These are connected through an internal connection switch (SW) 152 to be able to communicate with one another. The flash memory controller 155 includes a control unit 156, a microprogram interface 157, a data buffer 158, an error checking and correction (ECC) calculation circuit 159, and a flash memory interface (FM I/F) 160.

The SAS controller 151 communicates with a disk interface 127 using SAS protocol. The processor 153 executes a program stored in the memory 154 to process an I/O request from the disk interface 127. The I/O request is a read request or a write request.

The memory 123 stores the program to be executed by the processor 153, control data, and further, data in the flash memory chips 161 on a temporary basis. Specifically, the memory 123 temporarily stores write data transferred from a disk interface 127 to a chip 161 and temporarily stores read data to be transferred from the flash memory controller 155 to the disk interface 127.

The control unit 156 is a sequencer for controlling the microprogram interface 157, the data buffer 158, and the flash memory interface 160. The control unit 156 includes a register set 162. As will be described later, the register set 162 includes read pattern registers to store read patterns. A read pattern specifies the order of selection of read options. A read option is associated with parameter values (values of a set of parameters) for a flash memory chip 161 to read data.

The control unit 156 receives designation of the address to be accessed and a read pattern together with a read command from the processor 153. The control unit 156 determines the flash memory chip 161, and the block and the page in the chip 161 to be accessed from the address. The control unit 156 sequentially instructs the flash memory chip 161 of the read options in accordance with the designated read pattern in reading from the accessed flash memory chip 161.

The microprogram interface 157 is an interface to communicate with the processor 153. The data buffer 158 stores read data and write data on a temporary basis. The ECC calculation circuit 159 adds a redundant code for error correction (error correction code) to data to be written to a flash memory chip 161. The ECC calculation circuit 159 generates error correction codes for page data and adds the error correction codes to the page data. As will be described later, the ECC calculation circuit 159 generates an error correction code for each error correction unit of page data.

The ECC calculation circuit 159 performs error correction on data retrieved from a flash memory chip 161 using an error correction code. The error correction corrects a detected error.

The flash memory interface 160 is an interface to communicate with the flash memory chips 161 and writes data to and reads data from a selected flash memory chip 161. As will be described later, the flash memory interface 160 receives designation of a read option from the control unit 156 and instructs a flash memory chip 161 to use the read option. The flash memory chip 161 retrieves a value from a cell with parameter values specified in the designated read option.

Figure 2B:
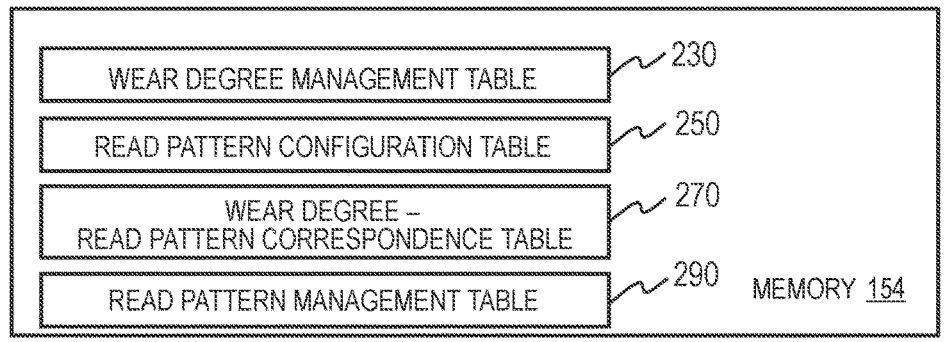
FIG. 2B illustrates control information stored in the memory of an SSD.

FIG. 2B illustrates control information stored in the memory 154. The memory 154 stores a wear degree management table 230, a read pattern configuration table 250, a wear degree-read pattern correspondence table 270, and a read pattern management table 290.

FIG. 3 illustrates a configuration example of the wear degree management table 230. The wear degree management table 230 manages information on the wear degrees of blocks in the flash memory chips 161. In this example, the table 230 stores information to be referred to in calculating the wear degrees. A wear degree indicates the ability of a cell to hold data and corresponds to the difference from the proper value for cell voltage. As will be described later, the read pattern to be used in a read from a flash memory chip 161 is determined depending on the wear degree of the area to retrieve data. Since data is erased in units of block, the wear degrees of cells are almost uniform in a block. Accordingly, managing the condition of the block leads to managing the wear degrees of the cells.

A chip number field indicates the number of a flash memory chip 161 and a block number field indicates the number of a block in the flash memory chip 161. An accumulated erase count field indicates the total erase count of the block after start of monitoring (for example, startup). The processor updates the accumulated erase count field in response to each erase request from the storage controller 120. A write date and time field indicates the date and time of the latest write (last write) to the block and is updated in response to each write request from the storage controller 120.

A field of number of ECC-corrected bits indicates the number of bits corrected in ECC detected from the block in a later-described condition check of the flash memory chip 161. A read option field indicates the read option number with which the data is correctly retrieved from the block in the condition check of the flash memory chip 161.

A retry read use rate field indicates an average number of retries in reading a page after the current read pattern is applied and is updated in response to each read request from the storage controller 120. An FM temperature field indicates the temperature measured by a temperature sensor (not-shown) included in the SSD 134 and corresponds to the temperature of the flash memory chip 161.

A field of number of unusable blocks in chip indicates the number of blocks that cannot be used in the flash memory chip 161. A field of read pattern to be used indicates the number of the read pattern to be used in the next read for the block. The wear degree management table 230 may hold the information by a unit of storage area different from block, for example, page.

FIG. 4 illustrates a configuration example of the read pattern configuration table 250. The read pattern configuration table 250 stores configuration information of each read pattern, which is information on the order of selection of read options in each read pattern. In the example of FIG. 4, twenty read patterns are provided and the read option numbers are 0 to 15, for example. The flash memory chips 161 hold parameter values for each of the read option numbers.

Figure 5:
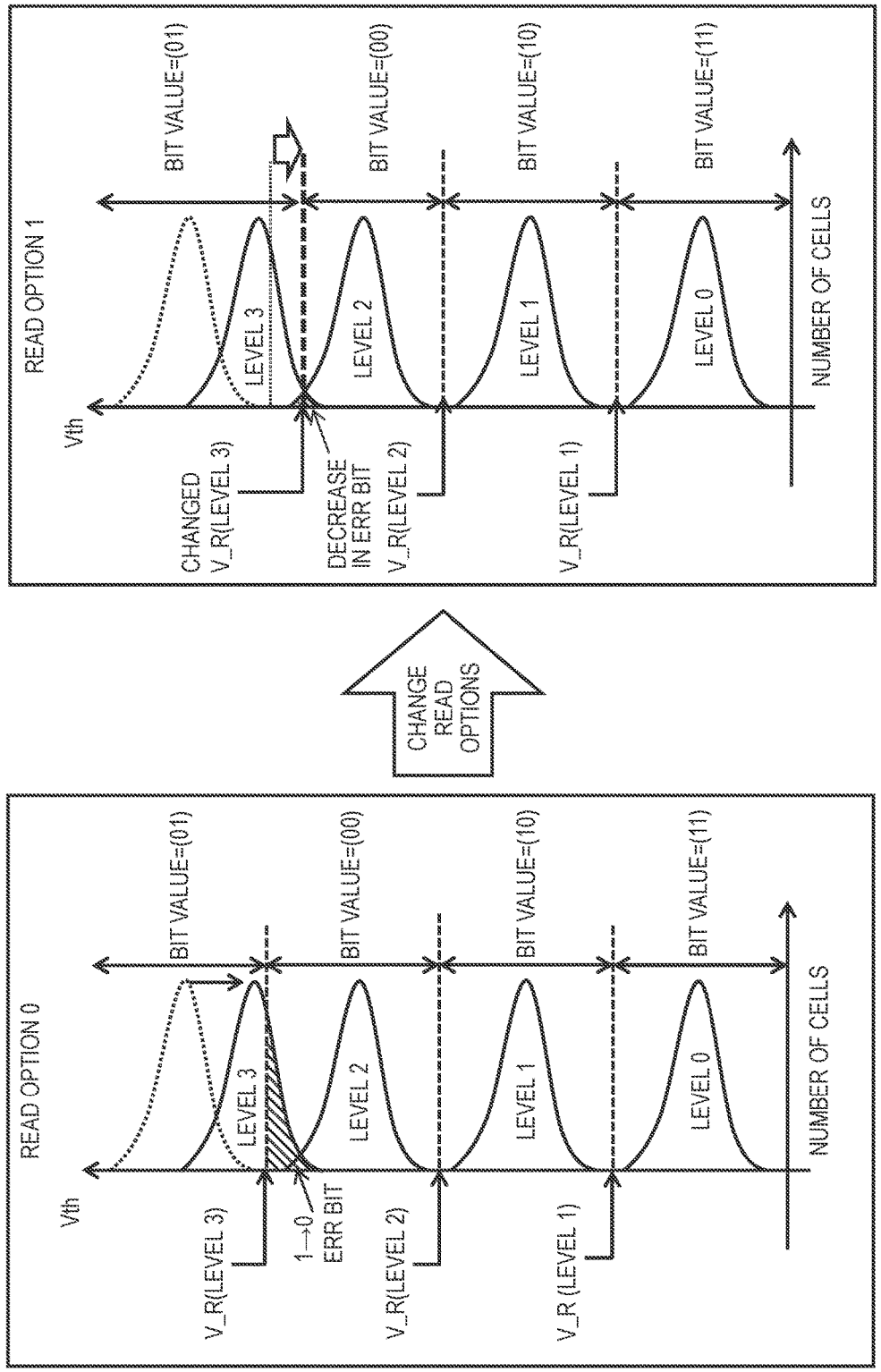
FIG. 5 illustrates an example of the relationship between the cause of an error bit and the read option.

FIG. 5 illustrates an example of the relationship between the cause of an error bit and the read option. FIG. 5 shows relations of threshold voltages Vth of the cells, the number of cells, and read reference voltages (V_R) under different read options. Although FIG. 5 shows examples based on a flash memory chip 161 including four-value cells (2-bit cells), this disclosure is applicable to a flash memory chip including binary cells or cells for providing values more than four.

The two graphs under Read Options 0 and 1 each show the distribution of threshold voltages Vth of the cells at each of Levels 0 to 3. Specifically, each graph indicates the relation of the threshold voltages Vth of a cell and the number of cells (probability distribution of threshold voltage Vth) at each of Levels 0 to 3.

To identify the level of a cell, three read reference voltages V_R (Level 1) to V_R (Level 3) are defined. The three read reference voltages are determined depending on the read option.

The threshold voltages Vth of a cell vary with deterioration of the cell or the time elapsed after a write. In the example of FIG. 5, the threshold voltage Vth for Level 3 is lowered. The read reference voltage V_R (Level 3) under Read Option 0 is too high in comparison to the threshold voltage Vth for Level 3; accordingly, the bit error rate will rise among the cells at Level 3, which increases the possibility that ECC calculation circuit 159 is unable to correct the errors in page data.

In contrast, Read Option 1 specifies a read reference voltage V_R (Level 3) lower than that of Read Option 0. The low read reference voltage V_R (level 3) lowers the bit error rate among the cells at Level 3 in which the voltage has varied. As noted from the above, selecting an appropriate read option reduces the bit errors in page data to the range correctable by the ECC calculation circuit 159.

FIG. 6 illustrates a configuration example of the wear degree-read pattern correspondence table 270. The wear degree-read pattern correspondence table 270 indicates relations between a wear degree of a flash memory chip 161 and a read pattern to be applied. The wear degree is determined for each unit of storage area having a specific size, based on the condition of the storage area of the flash memory chip 161. For example, the wear degree is determined for each block, each chip, or each page, based on I/O information (I/O history) such as the time elapsed after the latest write or the number of erases and physical condition information such as the chip temperature.

FIG. 7 illustrates a configuration example of the read pattern management table 290. The read pattern management table 290 indicates read patterns stored in the read pattern registers in the flash memory controller 155. The read pattern registers are included in the register set 162 of the control unit 156 and identified by read pattern register numbers. The processor 153 designates the read pattern to be used with a read pattern register number. The processor 153 may designate the read pattern with a read pattern number, instead of the register number.

Figure 8:
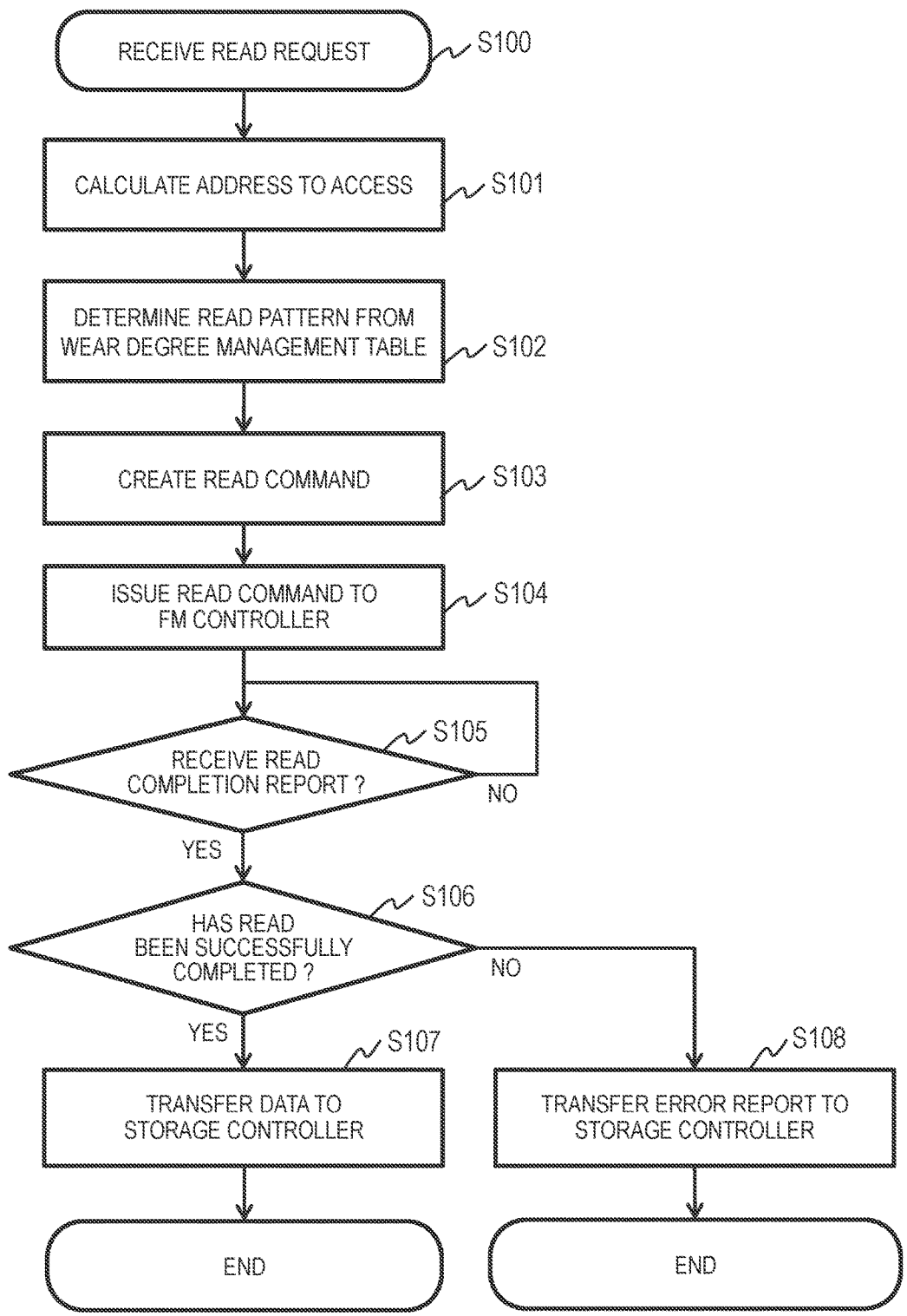
FIG. 8 is a flowchart of processing of a processor in a device controller in response to a read request from a storage controller.

FIG. 8 is a flowchart of processing of the processor 153 in the device controller 150 in response to a read request from the storage controller 120. The processor 153 receives the read request through the SAS controller 151 (S100).

The processor 153 analyzes the read request and calculates the area of a flash memory chip 161 to retrieve data (S101). For example, the read request includes the address to be accessed; the processor 153 determines the flash memory chip 161, the block, and the page to be accessed from the address, using mapping information held in the memory 154.

The processor 153 refers to the wear degree management table 230 and acquires the value of the field "Read pattern to be used" from the entry of the block to be accessed (S102). The processor 153 creates a read command designating the area to be accessed and the read pattern (S103). The processor 153 identifies the read pattern register number storing the read pattern with reference to the read pattern management table 290 and includes the read pattern register number in the read command.

If the read pattern management table 290 does not include the particular read pattern number, the processor 153 retrieves a read pattern number closest to the read pattern number from the read pattern management table 290 and acquires the read pattern register number associated with the retrieved read pattern number. The processor 153 may calculate the wear degree with reference to the wear degree management table 230 and retrieves the read pattern associated with the wear degree range closest to the calculated wear degree from the read pattern management table 290.

Alternatively, the processor 153 may acquire the read pattern indicated in the "Read pattern to be used" in the wear degree management table 230 from the read pattern configuration table 250 and rewrite one of the read pattern registers. The processor 153 includes the rewritten read pattern register number in the read command. Rewriting a read pattern will be described later with reference to FIG. 18.

The processor 153 issues the created read command to the flash memory controller 155 (S104). Specifically, the processor 153 stores the created read command to the memory 154 and the microprogram interface 157 acquires the read command from the memory 154.

The processor 153 waits for a read completion report from the flash memory controller 155 (S105). Upon receipt of the read completion report (S105: YES), the processor 153 determines whether the read has been successfully completed with reference to the read completion report (S106).

If the determination result at Step S106 is YES, the processor 153 transfers the data stored in the memory 154 to the storage controller 120 with the SAS controller 151 (S107). If the determination result at Step S106 is NO, the processor 153 transfers the error report to the storage controller 120 with the SAS controller 151 (S108). The storage controller 120 can recover the data that should have been retrieved with the parity calculation circuit 125 using data retrieved from other SSDs 134.

Figure 9:
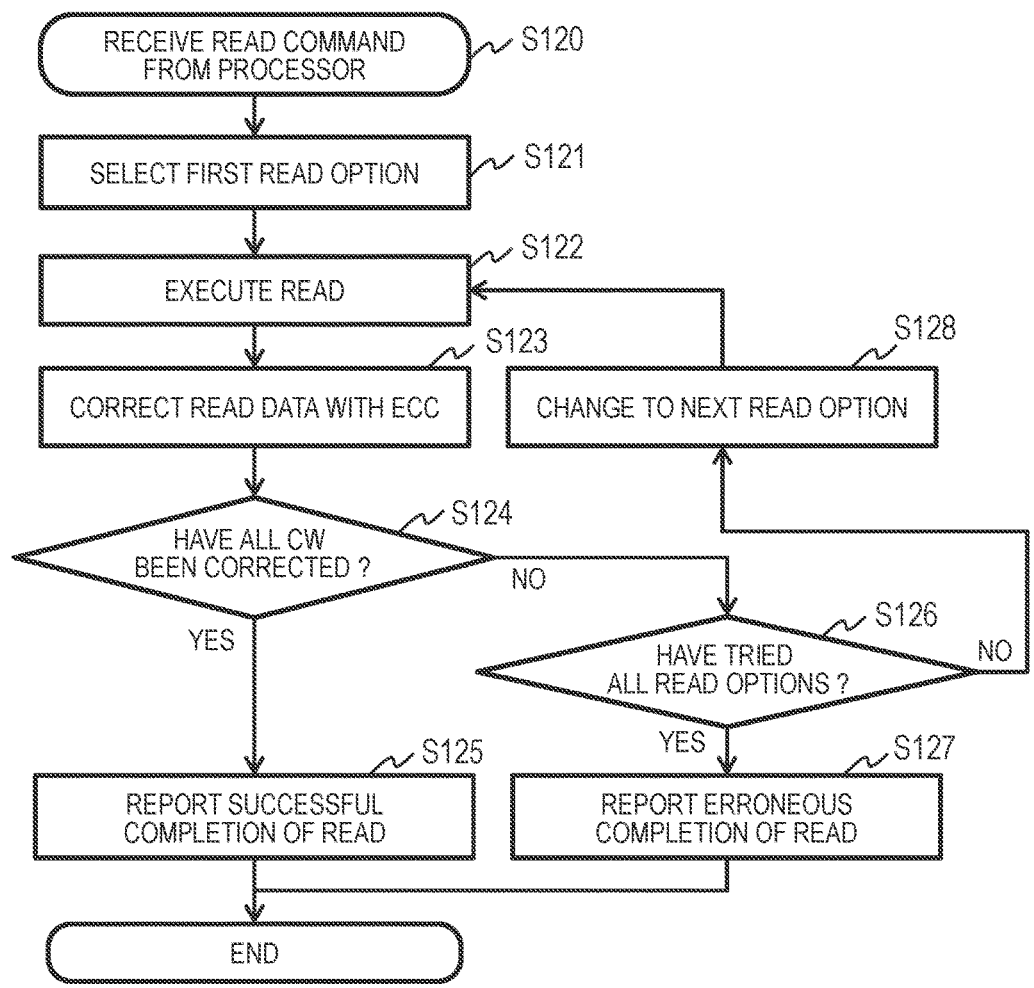
FIG. 9 is a flowchart of processing of a flash memory controller in response to a read command from the processor.

FIG. 9 is a flowchart of processing of the flash memory controller 155 in response to a read command from the processor 153. This flowchart is for the processing to read data in one page from a flash memory chip 161. The control unit 156 receives the read command through the microprogram interface 157 (S120).

The control unit 156 acquires the read pattern designated by the read command from the register set 162 and selects the first read option from the read pattern (S121). The read command indicates a read pattern register number, for example, and the control unit 156 acquires a read pattern from the register of the read pattern register number in the register set 162. The first read option can be a preset read option common to all flash memory chips, regardless of the read pattern.

The control unit 156 executes data read from a flash memory chip 161 using the selected read option (S122). Specifically, the control unit 156 sends a read command designating the read option number as well as the chip number and the page address in the chip to the flash memory interface 160. The flash memory interface 160 instructs the designated flash memory chip 161 to read data while designating the page address and the read option number.

Figure 10:
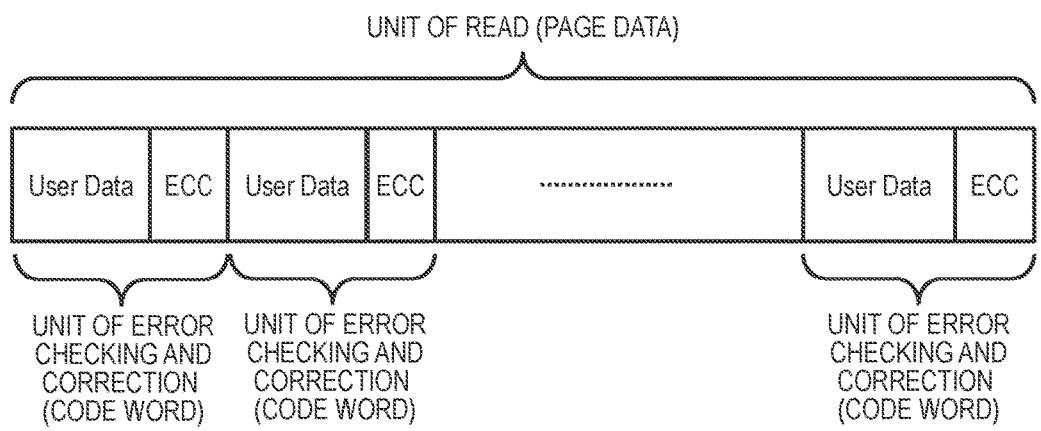
FIG. 10 illustrates a structure of page data.

The page data from the flash memory chip 161 is transferred to the ECC calculation circuit 159. The ECC calculation circuit 159 performs error correction on the page data (S123). FIG. 10 illustrates a structure of page data. Page data consists of a plurality of code words. A code word includes user data and an error correction code (ECC). The code word is a unit of error correction. The ECC calculation circuit 159 creates a code word by generating an error correction code for user data and further, performs error correction on each code word.

Returning to FIG. 9, the control unit 156 determines whether errors in all code words in the page have been corrected (S124). Specifically, the ECC calculation circuit 159 stores data after error correction to the data buffer 158 and further, sends error correction success or failure information to the control unit 156. The data does not have to go through the data buffer 158. The error correction success or failure information indicates whether the error correction on each code word is successful. If no error is detected, or if all detected errors are corrected, the error correction is successful. If the number of error bits is more than the limit of correction and an uncorrectable error exits, the error correction is failed (unavailable).

The page data stored in the data buffer 158 may include code words in which errors have successfully been corrected and code words in which errors cannot be corrected. The ECC calculation circuit 159 may be configured not to store the page data to the data buffer 158 when errors in some code word cannot be corrected.

If errors in all code words have been corrected (S124: YES), the control unit 156 notifies the processor 153 of successful completion of the read (S125). The processor 153 transfers the data stored in the data buffer 158 to the memory 154. The data may be directly transferred from the data buffer 158 to the storage controller 120 without using the memory 154.

If errors in some code word cannot be corrected (S124: NO), the control unit 156 determines whether all read options in the read pattern have been tried (S126). If all read options have been tried (S126: YES), the control unit 156 notifies the processor 153 of erroneous completion of the read (S127).

If some untried read option remains (S126: NO), the control unit 156 selects the next read option from the read pattern (S128) and executes a read from the flash memory chip 161 using the selected read option (S122).

As described above, the flash memory controller 155 holds a read pattern and repeatedly retries a read using a read option selected in the order specified by the read pattern. This configuration reduces the number of times of intervention of the processor 153 and significantly reduces the overhead for the read retries.

In the flowchart of FIG. 9, the control unit 156 notifies the processor 153 of successful completion if errors in all code words of page data retrieved in one read are correctable. Unlike this configuration, the control unit 156 may form page data that does not include an error by merging user data in error-corrected code words. Here, the error-corrected data includes data from which no error is detected.

Figure 11:
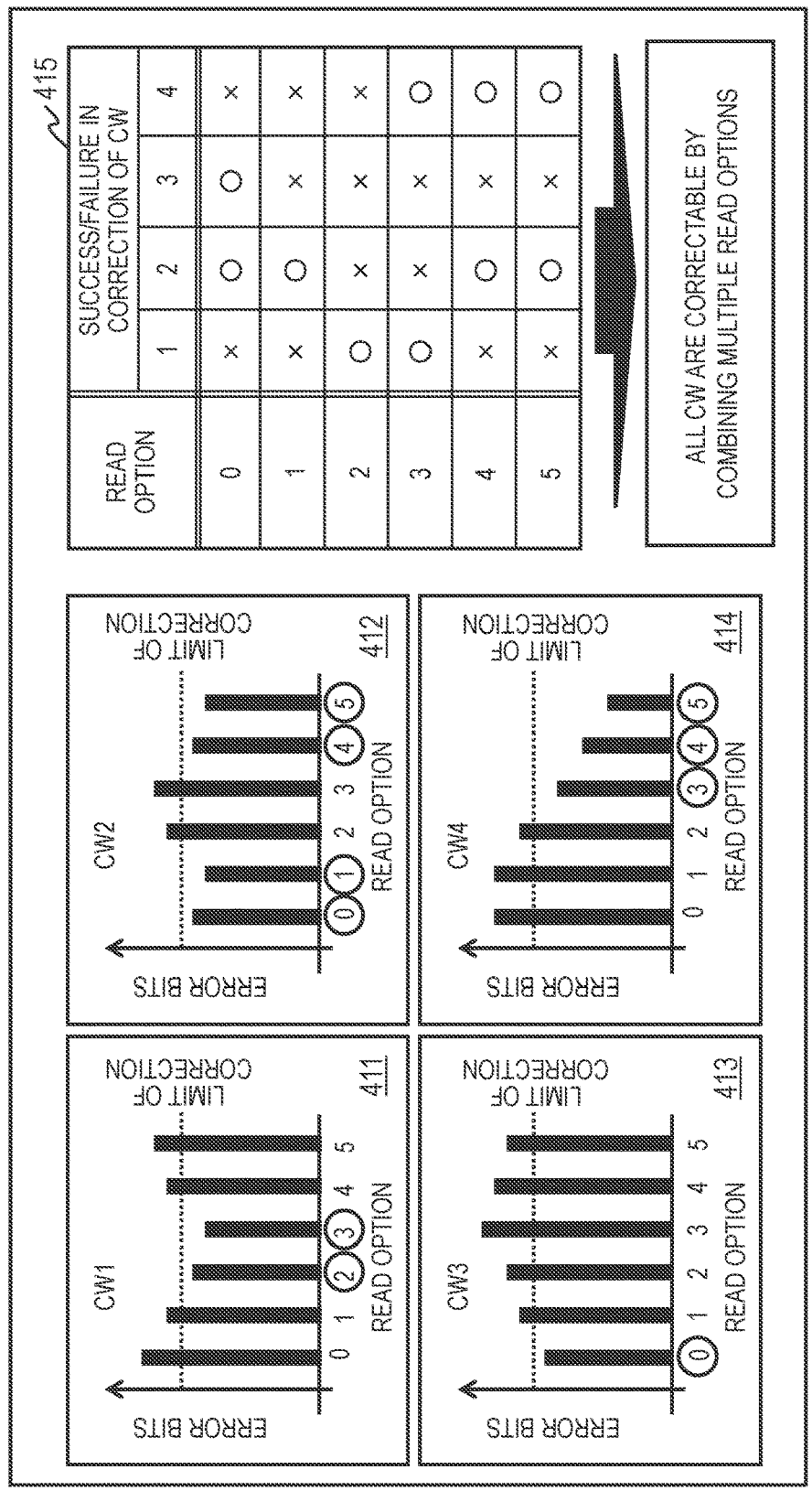
FIG. 11 illustrates examples of relations between a read option and success or failure in (availability of) error correction of code words.

FIG. 11 illustrates examples of relations between a read option and success or failure in (availability of) error correction of code words. The graphs 411 to 414 each show relations between the number of error bits in code words 1 to 4 and a read option.

The code word 1 shows error bits less than the limit of correction under Read Option 2 or 3. The code word 2 shows error bits less than the limit of correction under Read Option 0, 1, 4, or 5. The code word 3 shows error bits less than the limit of correction under Read Option 0. The code word 4 shows error bits less than the limit of correction under Read Option 3, 4, or 5.

The table 415 shows success or failure in error correction of each code word under individual read options. If a correct code word is obtained, the error correction on the code word is successful; if an uncorrectable error exists, the error correction is unsuccessful (unavailable).

As understood from the table 415, no read option exists that can correct all code words by itself. However, each code word can be corrected by at least one of the read options. Accordingly, page data in which all code words are corrected can be formed by merging user data of the code words corrected under different read options.

Figure 12:
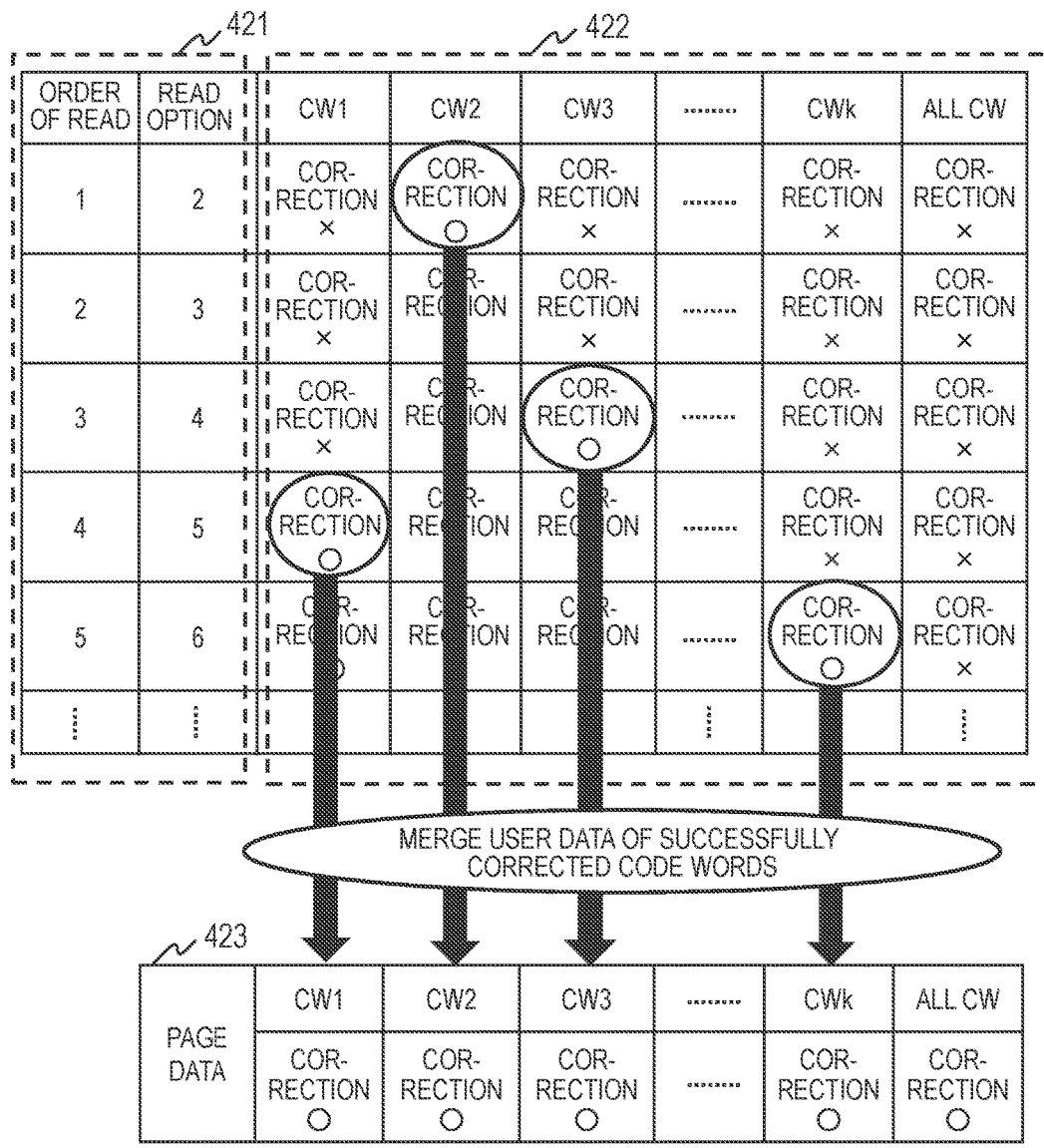
FIG. 12 schematically illustrates merging user data of code words corrected under different read options.

FIG. 12 schematically illustrates merging user data of code words corrected under different read options. A read is repeated with a different read option in accordance with a read pattern 421. The table 422 shows results of correction of the code words with each read option. Although at least one code word cannot be corrected at a read with any one of the read options, each code word can be corrected with one of the read options.

The table 423 shows the success or failure in correction of code words in page data after merging user data in the code words corrected under different read options. Merging user data in the code words corrected under different read options forms correct page data that does not include an error.

Figure 13:
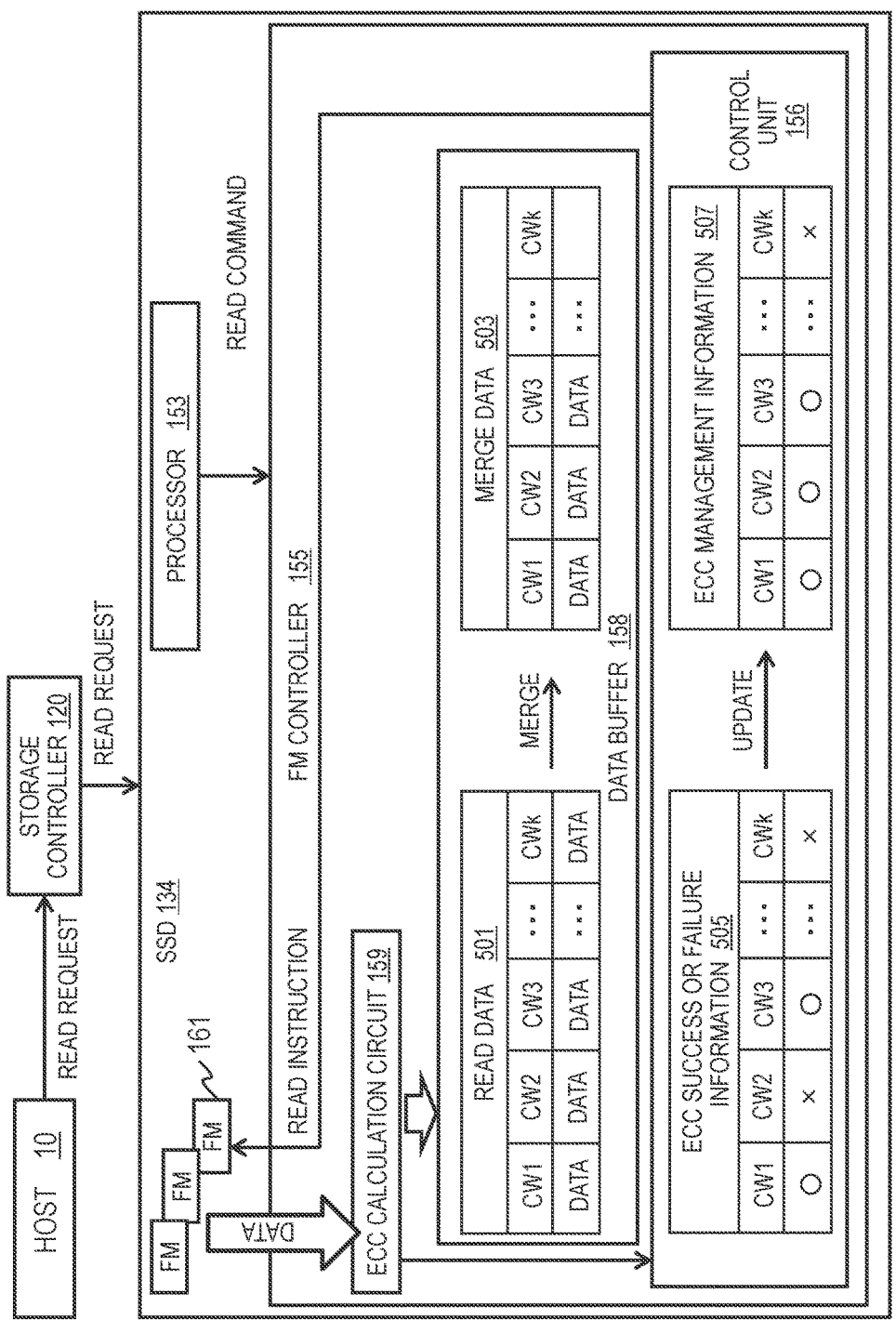
FIG. 13 schematically illustrates processing to merge user data in code words corrected under different read options.

FIG. 13 schematically illustrates processing to merge user data in code words corrected under different read options. In FIG. 13, the flash memory controller 155 merges user data in the code words corrected under different read options to create page data in which all errors have been corrected.

The storage controller 120 that has received a read request from a host computer 10 sends a corresponding read request to an SSD 134. The processor 153 of the SSD 134 analyzes the read request and issues a corresponding read command to the flash memory controller 155.

The control unit 156 of the flash memory controller 155 reads data from a flash memory chip 161 with a read option according to the read command. The read data is transferred to the ECC calculation circuit 159 and the ECC calculation circuit 159 performs error correction on each code word.

The ECC calculation circuit 159 stores read data (page data) 501 on which error correction has been performed to the data buffer 158. The ECC calculation circuit 159 sends ECC success or failure information 505 on the page data to the control unit 156. The ECC success or failure information 505 indicates whether error correction on each code word in the read data 501 is successful or unsuccessful.

The control unit 156 holds ECC management information 507. The data buffer 158 stores merge data 503. The merge data 503 is formed by merging user data included in the code words that have been corrected through sequential reads with the read options in a read pattern. User data in a corrected code word is merged into the merge data 503 at each read. This configuration saves the storage area required to merge data.

The ECC management information 507 indicates whether each code word has been corrected in the previous reads. If a code word has been corrected with one of the read options, the ECC management information 507 indicates that the corrected data of the code word is included in the merge data 503. If a code word has not been corrected with any of the read options, the ECC management information 507 indicates that corrected data of the code word is not included in the merge data 503.

The control unit 156 merges user data in a corrected code word in the read data 501 with the merge data 503 with reference to the ECC success or failure information 505 acquired from the ECC calculation circuit 159 and the ECC management information 507.

In other words, the control unit 156 compares the ECC success or failure information 505 with the ECC management information 507 to identify the code word that has been corrected in the latest read but is not included in the merge data 503. The control unit 156 adds the user data of the identified corrected code word to the merge data 503. The control unit 156 updates the ECC management information 507 with the information on the newly added code word. Alternatively, the control unit 156 adds user data of all code words that have been corrected at the latest read to the merge data 503. The control unit 156 updates the ECC management information 507 with the information on the code words that have been corrected at the latest read.

Reads with different read options are sequentially executed until all errors in page data acquired in a single read are corrected or user data in all corrected code words of the page data is added to the merge data 503. If acquiring read data 501 that does not include an error in a single read with one of the read options, the control unit 156 forwards the data to the memory 154. Alternatively, if user data in all code words is included in merge data 503, the control unit 156 transfers the merge data 503 to the memory 154.

Figure 14:
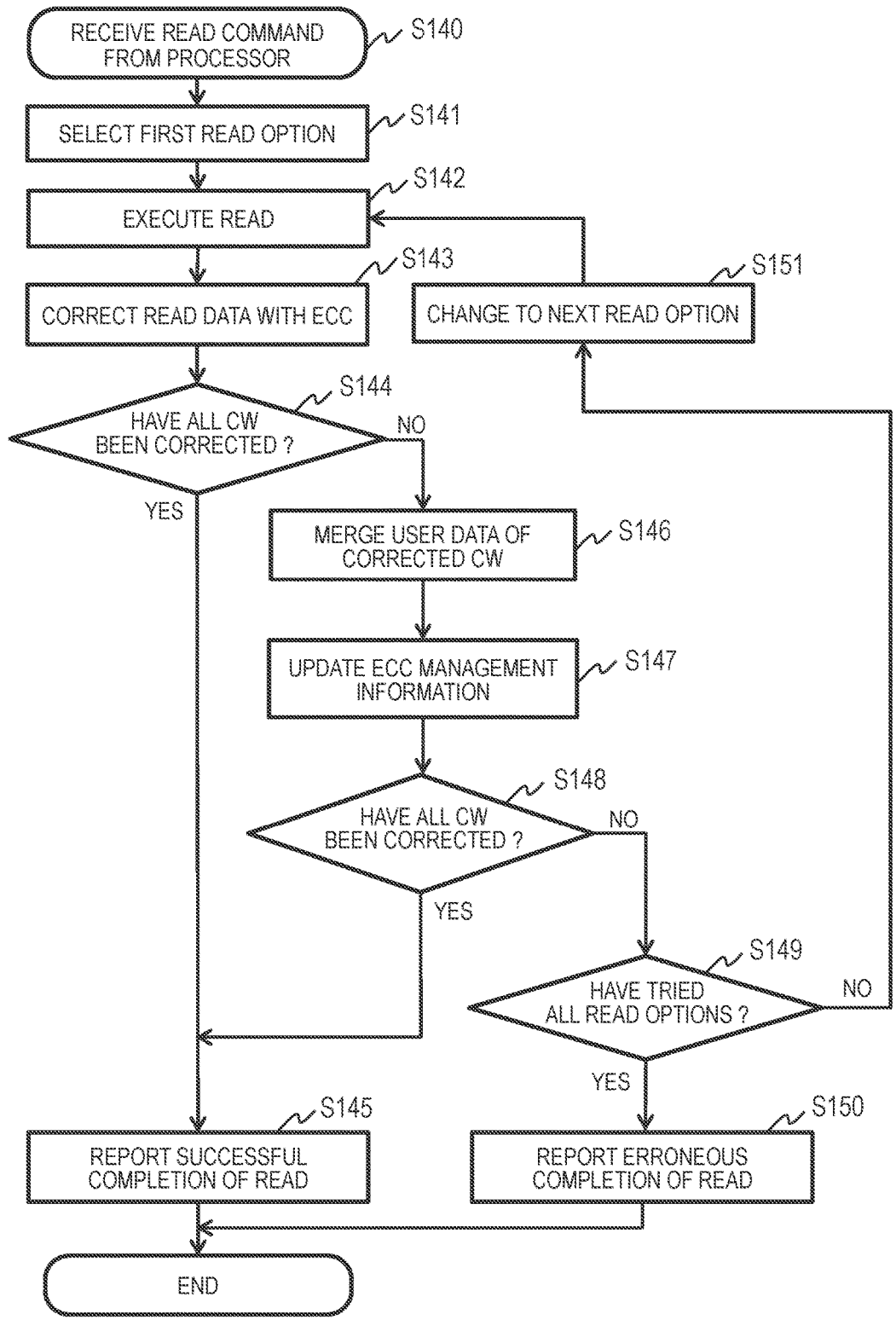
FIG. 14 is a flowchart of processing of a flash memory controller in response to a read command from the processor.

FIG. 14 is a flowchart of the processing described with reference to FIG. 13, that is, a flowchart of the processing of the flash memory controller 155 in response to a read command from the processor 153. In this processing, the control unit 156 merges user data in the code words corrected under different read options to form correct page data that does not include an error.

Steps S140 to S145 are the same as Steps S120 to S125, respectively, in FIG. 9. In this processing, if all code words are corrected in one read, the corrected page data is transferred to the memory 154 like the processing in FIG. 9.

At Step S144, if the ECC success or failure information 505 received from the ECC calculation circuit 159 indicates that the page data read from a flash memory chip 161 includes an uncorrectable code word (S144: NO), the control unit 156 selects user data of the corrected code words from the read data 501 and merges the user data with the merge data 503 (S146).

In other words, the control unit 156 adds user data of a corrected code word that is not stored in the merge data 503 to the merge data 503. Alternatively, the control unit 156 adds user data of all corrected code words to the merge data 503. The merge data 503 is created at the first read, from user data of all code words in which errors have been successfully corrected.

The control unit 156 updates the ECC management information 507 with the information on the code words added to the merge data 503 (S147). The control unit 156 creates the ECC management information 507 at the first read and thereafter, updates the information 507.

The control unit 156 determines whether all code words in the page data have been corrected and included in the merge data 503 with reference to the ECC management information 507 (S148). If user data of all code words is included in the merge data 503 (S148: YES), the control unit 156 sends a report of successful completion of the read together with the merge data 503.

If user data of some code word is not included in the merge data 503 (S148: NO), the control unit 156 proceeds to Step S149. Steps S149, S150, and S151 are the same as Steps S126, S127, and S128, respectively.

The above-described creating page data by merging user data of the code words corrected under different read options decreases the probability of read error. The merge processing is performed by the flash memory controller 155 to reduce the overhead, compared to the case where the processor 153 involves in the processing.

Unlike the above-described example, the processor 153 may merge the user data of the corrected code words, in place of the flash memory controller 155. Then, the merge function can be designed and implemented in the SSD 134 easily, compared to the case where the merge function is implemented in the flash memory controller 155.

Figure 15:
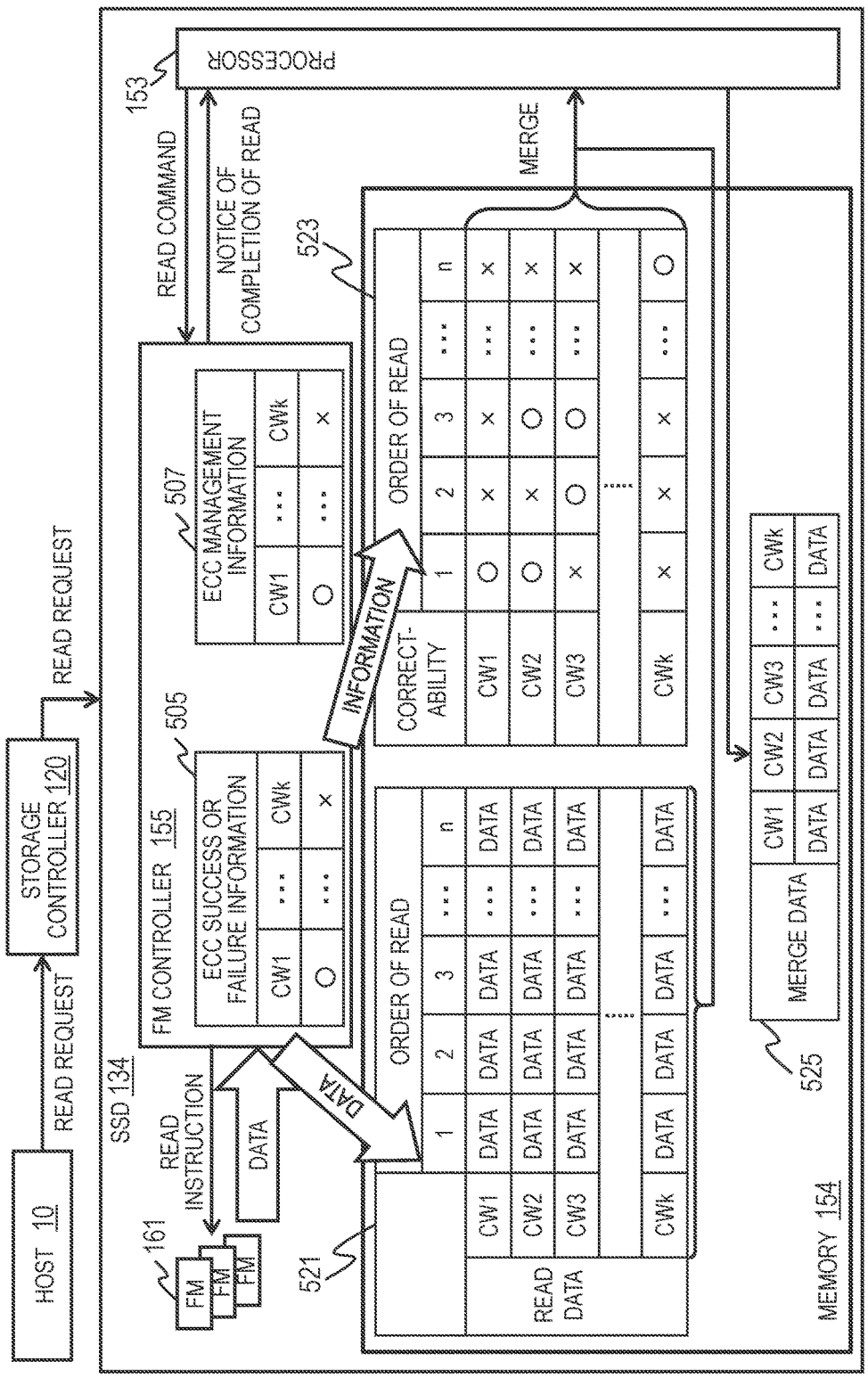
FIG. 15 illustrates an example where the processor merges user data of code words.

FIG. 15 illustrates an example where the processor 153 merges the user data of code words. The processor 153 creates a read command corresponding to a read request from the storage controller 120 and issues the read command to the flash memory controller 155. The read command designates a read pattern.

The flash memory controller 155 retrieves data from a flash memory chip 161 with a selected read option, performs error correction, and transfers the data to the memory 154. The transferred data is stored to a read data area 521. The flash memory controller 155 updates ECC management information 507 with ECC success or failure information 505. Creating the ECC success or failure information 505 and updating the ECC management information 507 are performed in the same way as the configuration described with reference to FIGS. 13 and 14.

The flash memory controller 155 sends the ECC success or failure information 505 to the processor 153. The processor 153 adds the ECC success or failure information 505 to ECC success or failure management information 523.

The flash memory controller 155 repeats a read from the flash memory chip 161 with a different read option in accordance with the read pattern. As described above, the ECC management information 507 is updated, corrected read data is stored to the read data area 521, and ECC success or failure information 505 is added to the ECC success or failure management information 523.

When the ECC management information 507 indicates that errors in all code words have been corrected, the flash memory controller 155 notifies the processor 153 of successful completion of the read. Errors in all code words can be corrected with a single read or multiple reads.

The processor 153 merges user data of the corrected code words stored in the read data area 521 with reference to the ECC success or failure management information 523 to create merge data 525. The merge data 525 is correct page data that does not include an error. The processor 153 transfers the merge data 525 to the storage controller 120. If all code words are corrected in a single read, the merging is unnecessary.

Figure 16:
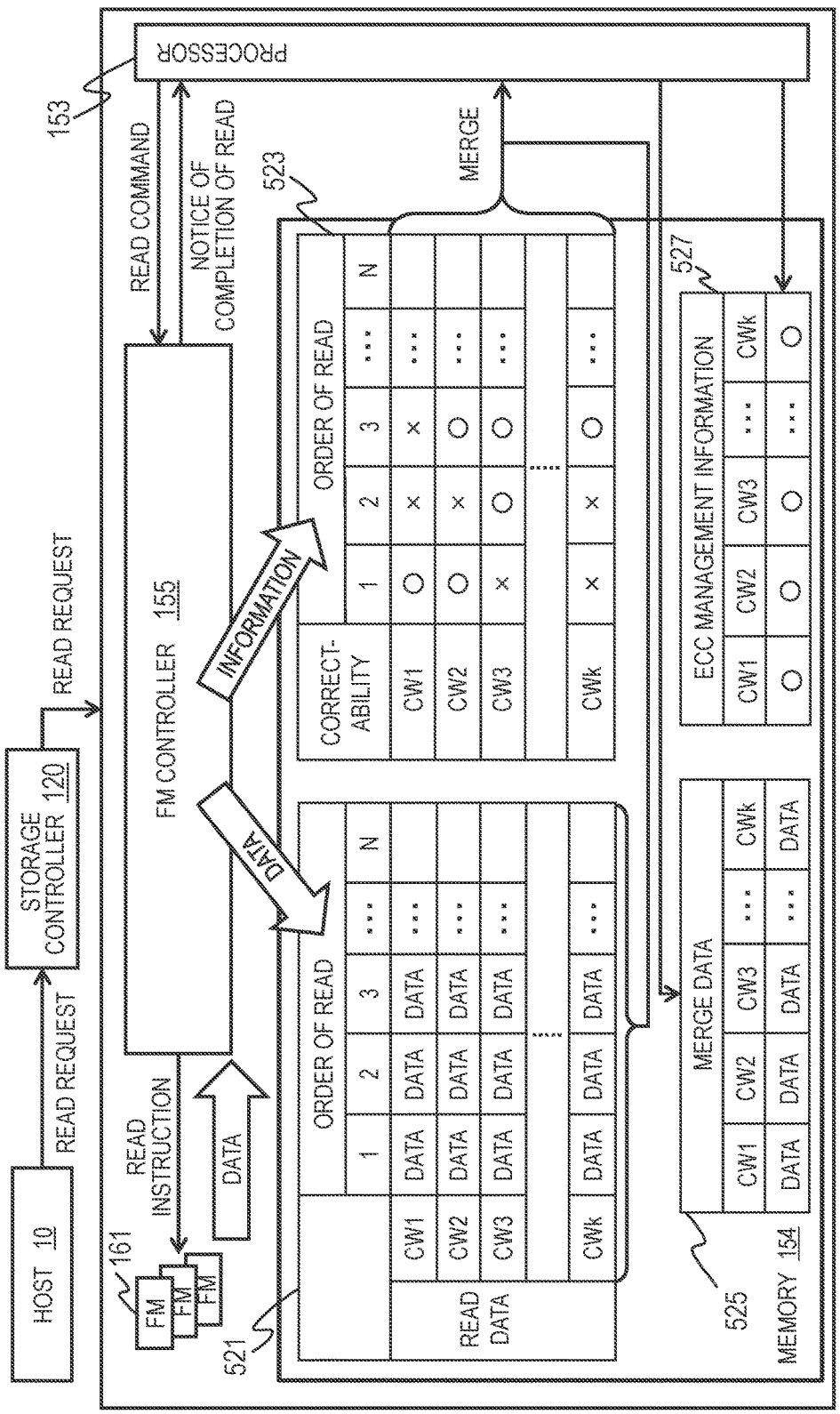
FIG. 16 illustrates another example where the processor merges user data of code words.

FIG. 16 illustrates another example where the processor 153 merges the user data of code words. The flash memory controller 155 in the example of FIG. 15 repeats a retry read in accordance with a read pattern and determines whether errors in all code words have been corrected.

The processor 153 in this example designates a read option, instead of a read pattern, in the read command. The flash memory controller 155 retrieves data from a flash memory chip 161 with the designated read option, performs error correction, and then transfers the data to the memory 154. The transferred data is stored to the read data area 521. In this example, the flash memory controller 155 does not hold a read pattern or does not refer to a read pattern.

The flash memory controller 155 sends ECC success or failure information 505 to the processor 153. The processor 153 adds the ECC success or failure information 505 to the ECC success or failure management information 523. The processor 153 merges the ECC success or failure information 523 to create ECC success or failure information 527.

If the ECC success or failure information 527 indicates that all code words have been corrected, the processor 153 merges the user data of the corrected code words stored in the read data area 521 with reference to the ECC success or failure management information 523 to create merge data 525. The merge data 525 is correct page data that does not include an error. The processor 153 transfers the merge data 525 to the storage controller 120. If all code words are corrected in a single read, the merging is unnecessary.

The above-described configuration that the processor 153 merges user data of the corrected code words eliminates the merge function to be implemented in the flash memory controller 155, which facilitates design modification.

Figure 17:
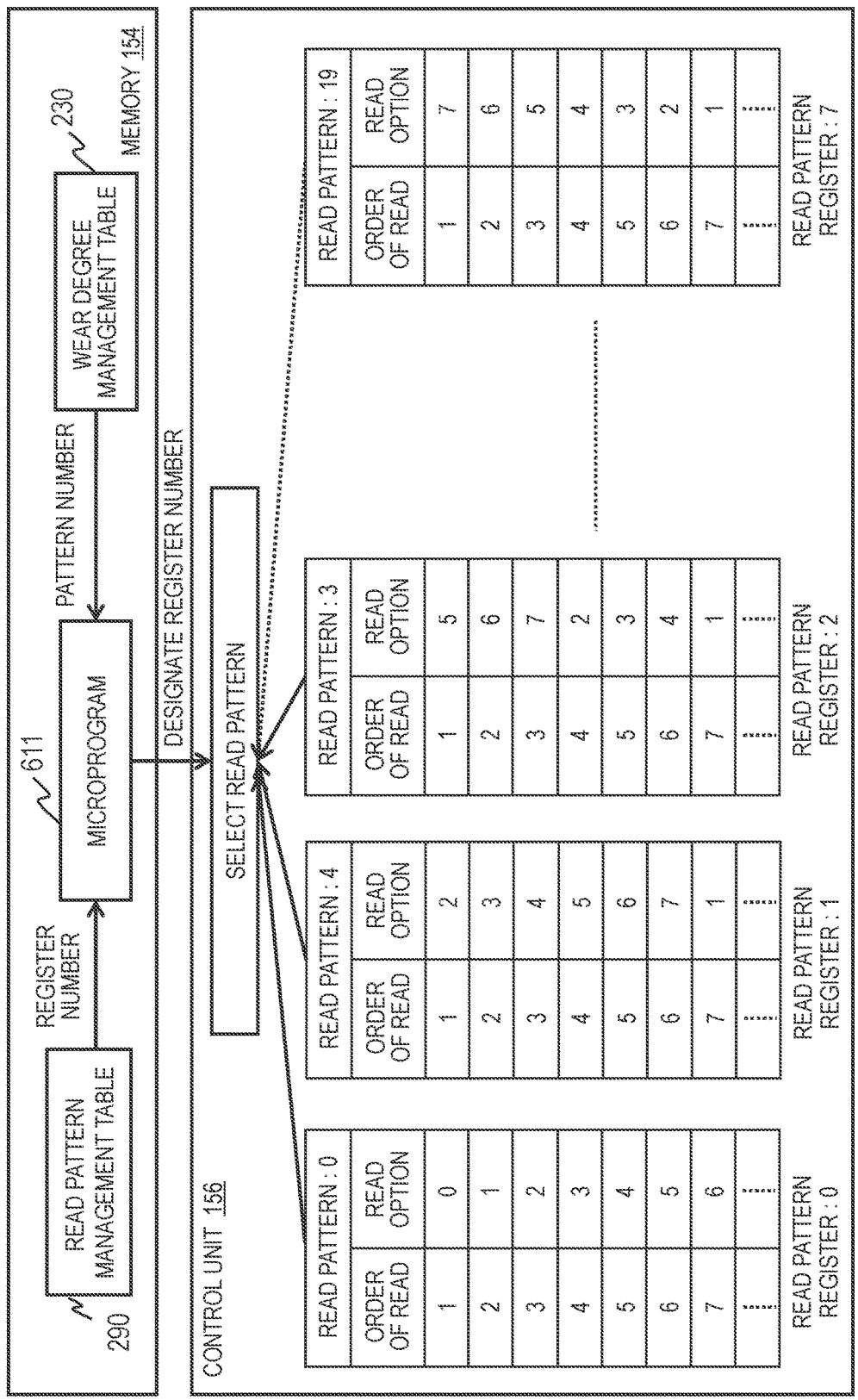
FIG. 17 schematically illustrates selecting a read pattern in response to a read request.

FIG. 17 schematically illustrates selecting a read pattern in response to a read request. The microprogram 611 executed by the processor 153 acquires the read pattern number of a read pattern to be used for the block designated by the read request with reference to the wear degree management table 230. The microprogram 611 acquires the read pattern register number associated with the acquired read pattern number with reference to the read pattern management table 290.

The microprogram 611 issues a read command to the flash memory controller 155 with designation of the acquired read pattern register number. The control unit 156 acquires the read pattern stored in the read pattern register in the designated read pattern register number and controls the read options in read retries in accordance with the read pattern.

In the example of FIG. 17, the control unit 156 has seven read pattern registers. In the meanwhile, the read pattern configuration table 250 holds 20 read patterns. It is preferable to prepare many read patterns to achieve efficient read. However, it is preferable that the number of read pattern registers be smaller to save the hardware resources. The processor 153 satisfies the foregoing demand by changing the read patterns stored in the read pattern registers.

Figure 18:
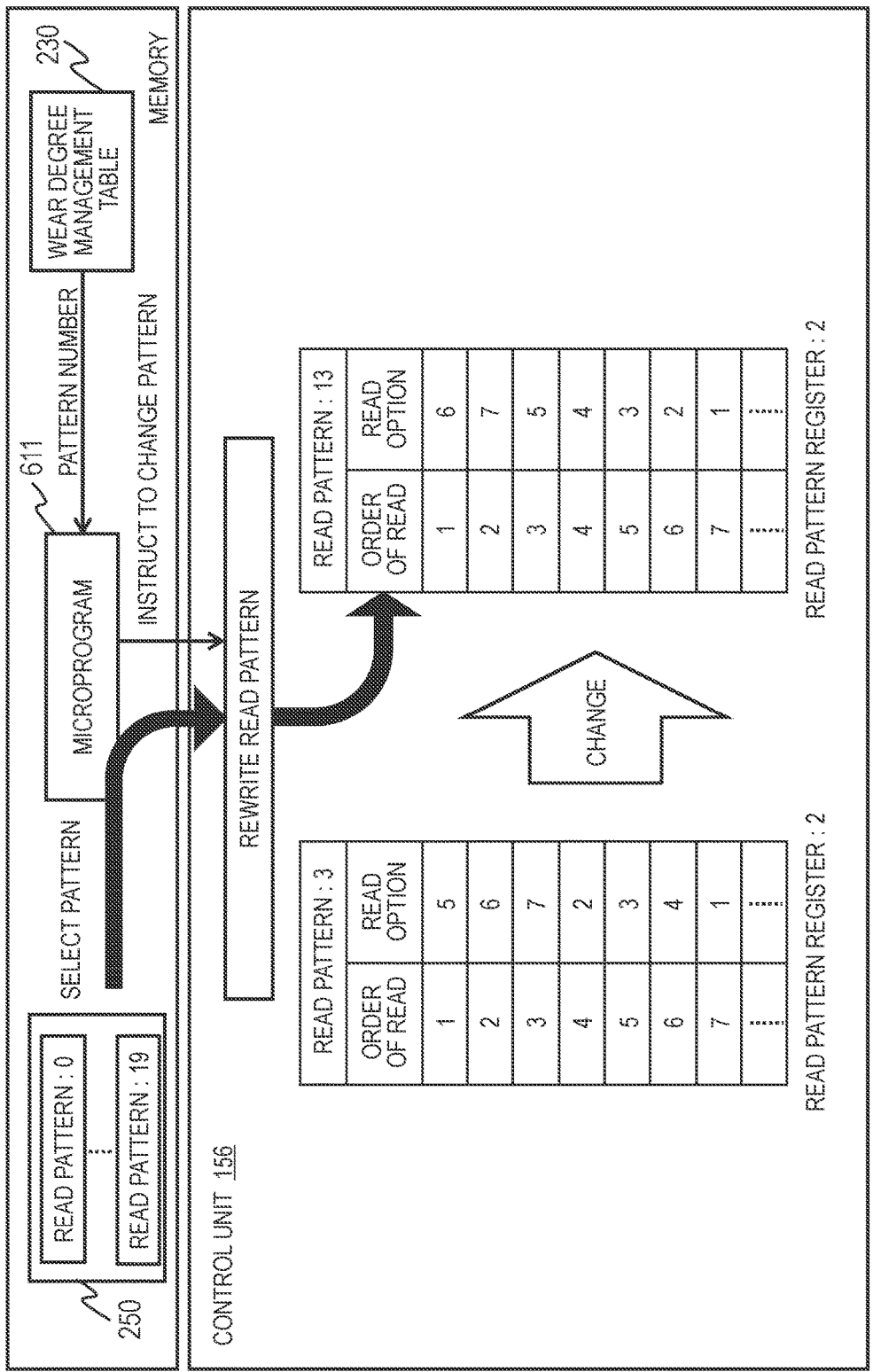
FIG. 18 schematically illustrates rewriting a read pattern stored in a read pattern register.

FIG. 18 schematically illustrates rewriting a read pattern stored in a read pattern register. For example, if the read pattern management table 290 referred to in a read does not include the read pattern number acquired from the wear degree management table 230, the microprogram 611 rewrites a read pattern in a read pattern register. Alternatively, as will be described later, the microprogram 611 rewrites a read pattern in a read pattern register depending on the condition check on the flash memory chips 161.

The microprogram 611 acquires a read pattern of a specific read pattern number from the read pattern configuration table 250. The microprogram 611 instructs the flash memory controller 155 to change a read pattern with designation of a read pattern register number and sends the read pattern. The control unit 156 stores the received new read pattern to the designated read pattern register.

In the example of FIG. 18, the read pattern in the read pattern register 2 is rewritten. Before the change, the read pattern register 2 holds Read Pattern 3; Read Pattern 3 is rewritten with Read Pattern 13. The microprogram 611 updates the read pattern management table 290 with the information on the read pattern register where the read pattern has been replaced.

Figure 19:
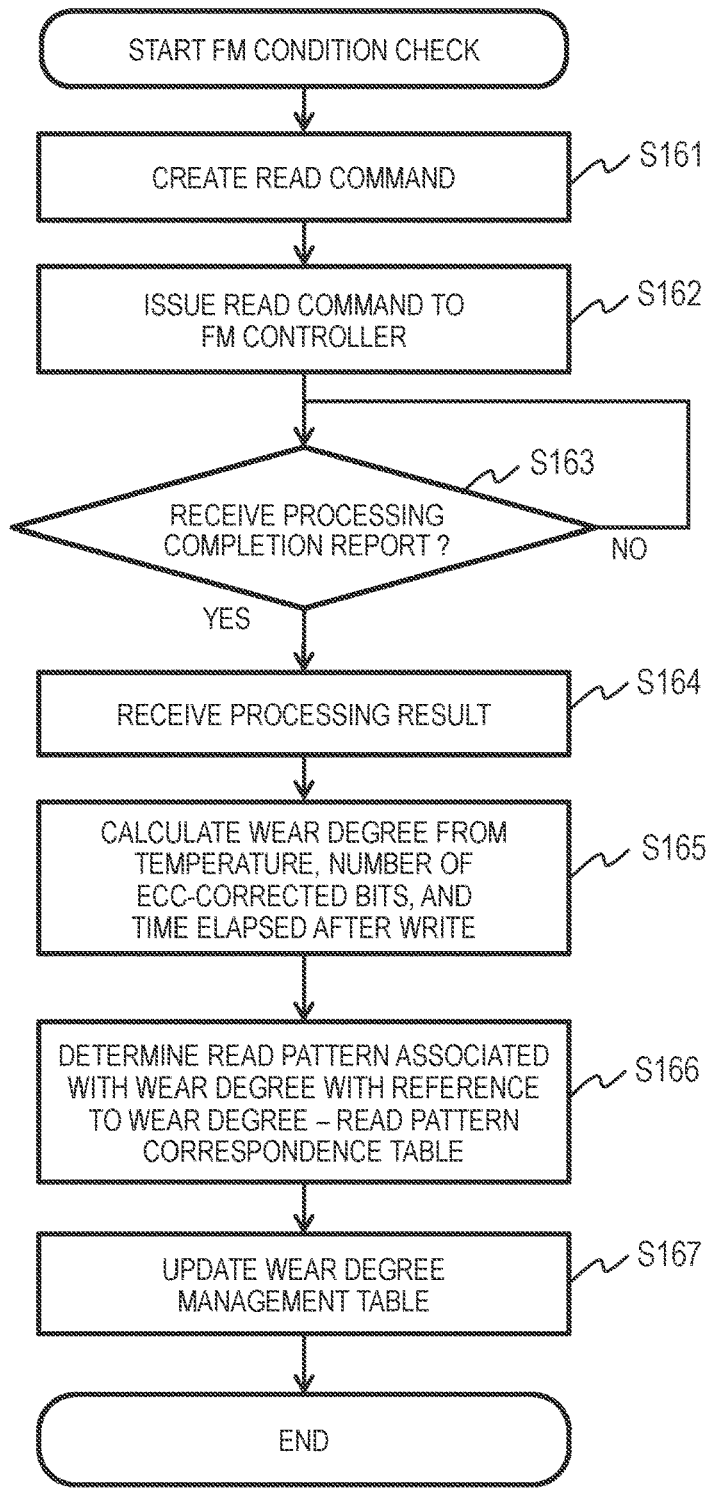
FIG. 19 is a flowchart of condition check on a flash memory chip and update of a wear degree management table in accordance with the result of the condition check.

FIG. 19 is a flowchart of condition check on a flash memory chip 161 and update of the wear degree management table 230 in accordance with the result of the condition check. The condition check of the flash memory chips 161 is performed independently from a read/write of a flash memory chip 161 and performed periodically, for example.

The processor 153 creates a read command (S161) and issues the read command to the flash memory controller 155 (S162). The read command designates a read option and an area. The area designated by the read command can be one block. The area to be designated is determined depending on the management unit in the wear degree management table 230. The designated area can be multiple blocks.

The processor 153 waits for a processing completion report for the read command from the flash memory controller 155 (S163). If receiving an error report, the processor 153 issues another read command for the same area with designation of a different read option. If receiving a processing completion report (S164), the processor 153 analyzes the processing completion report and acquires the number of errors corrected by the ECC calculation circuit 159.

The processor 153 calculates the wear degree of the block (S165). The processor 153 calculates the wear degree based on the current chip temperature, the number of ECC-corrected bits in the read, and the time elapsed after the latest write. The chip temperature is determined from the temperature information acquired from a not-shown sensor. The time elapsed after the latest write is the time from the write date and time in the wear degree management table 230 to the current time. The wear degree of a flash memory chip can be calculated using the average of the values of the blocks.

The wear degree is expressed by a function increasing with increase in chip temperature, number of ECC-corrected bits, and time elapsed after the latest write. The function for the wear degree is predetermined in accordance with the design. The wear degree may be calculated using only a part of these values or using other values. The wear degree can be calculated using I/O information (I/O history) such as the number of ECC-corrected bits, the time elapsed after the latest write, and accumulated number of erases and information on physical conditions such as the chip temperature. The wear degree can be accurately calculated with these values.

The processor 153 determines a read pattern associated with the calculated wear degree with reference to the wear degree-read pattern correspondence table 270 (S166). The processor 153 updates the wear degree management table 230 with the result of the current check (S167). Specifically, the processor 153 updates the fields of the number of ECC-corrected bits, the read option, the FM temperature, and the read pattern to be used for the checked block. Through this processing, the wear degree management table 230 is updated and an appropriate read pattern can be selected.

Figure 20:
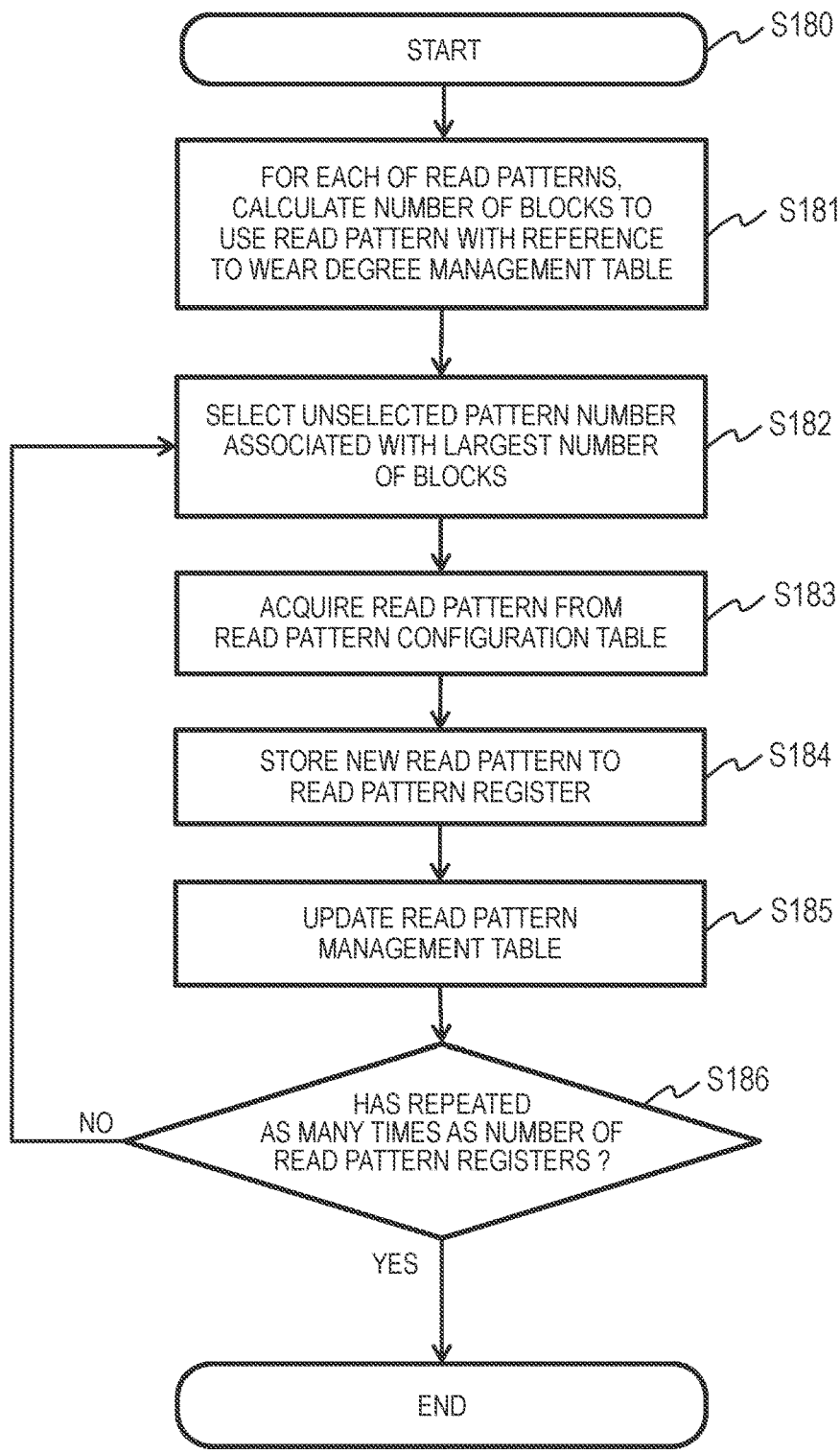
FIG. 20 is a flowchart of updating read patterns stored in the flash memory controller.

FIG. 20 is a flowchart of updating read patterns stored in the flash memory controller 155. This processing is performed after update of the wear degree management table 230, which has been described with reference to FIG. 19.

The processor 153 calculates the number of blocks (areas) to use a read pattern with reference to the wear degree management table 230, for each of the read patterns (S181). Specifically, the processor 153 counts the entries of the wear degree management table 230 including a particular read pattern, for each of the read patterns. The processor 153 selects an unselected read pattern number which is associated with the largest number of blocks (S182). The processor 153 acquires the read pattern assigned the read pattern number from the read pattern configuration table 250 (S183).

The processor 153 stores a new read pattern to a read pattern register in the flash memory controller 155 (S184). The processor 153 updates the information on the read pattern register that has stored the new read pattern. The processor 153 repeats Steps S182 to S185 as many times as the number of read pattern registers (S186). Through this processing, read patterns that could be used with high probabilities can be stored in advance in the flash memory controller 155.

This invention is not limited to the above-described embodiment but includes various modifications. The foregoing embodiment has been described in detail for better understanding of this invention and is not limited to the one including all the configurations described above. A part of the configuration of one example may be replaced with that of another example; the configuration of one example may be incorporated to the configuration of another example. A part of the configuration of each example may be added, deleted, or replaced by that of a different configuration.

The above-described configurations, functions, and processing units, for all or a part of them, may be implemented by hardware: for example, by designing an integrated circuit. The above-described configurations and functions may be implemented by software, which means that a processor interprets and executes programs for implementing the functions. The information of programs, tables, and files to implement the functions may be stored in a storage device such as a memory, a hard disk drive, or an solid state drive (SSD), or a storage medium such as an IC card, or an SD card. The drawings show control lines and information lines as considered necessary for explanations but do not show all control lines or information lines in the products. It can be considered that most of all components are actually interconnected.

What is claimed is:

1. A flash memory device comprising:
a flash memory chip configured to store data;
a processor configured to interpret a read request from an external device and create a read command; and
a flash memory controller configured to receive the read command from the processor and read the data from the flash memory chip in accordance with the read command,
wherein the flash memory controller is configured to:
hold a read pattern defining an order of selection of a plurality of read options each specifying a respective parameter value for reading the data from the flash memory chip,
execute error correction on the data, read from the flash memory chip in accordance with the read command, in predetermined units, and
designate a next read option specified in the read pattern to read the data from the flash memory chip when all errors in the read data are not corrected by the error correction,
wherein the processor is configured to transfer merge data in response to the read request, and the merge data is corrected data in the predetermined units which have been read with different read options and merged together.

2. The flash memory device according to claim 1,
wherein the flash memory controller is configured to hold a plurality of read patterns,
wherein the processor is configured to designate a read pattern to be used by the flash memory controller from the plurality of read patterns, and
wherein the flash memory controller is configured to refer to the designated read pattern to read the data from the flash memory chip in accordance with the read command.

3. The flash memory device according to claim 2, wherein the processor is configured to determine the read pattern to be designated for the flash memory controller based on a wear level of an area to be accessed in the flash memory chip in accordance with the read command.

4. The flash memory device according to claim 2, wherein the processor is configured to change the read patterns held by the flash memory controller.

5. The flash memory device according to claim 4, wherein the processor is configured to:
manage the read patterns held by the flash memory controller; and
change the read patterns held by the flash memory controller to include the designated read pattern when the flash memory controller does not hold the designated read pattern.

6. The flash memory device according to claim 4, wherein the processor is configured to:
hold a plurality of read patterns,
determine a read pattern for each of a plurality of areas of the flash memory chip based on conditions of each of the plurality of areas,
select the read patterns to be held by the flash memory controller from the plurality of read patterns based on a number of the areas in the flash memory chip associated with each of the plurality of read patterns.

7. A flash memory device comprising:
a flash memory chip configured to store data;
a processor configured to interpret a read request from an external device and create a read command; and
a flash memory controller configured to receive the read command from the processor and read the data from the flash memory chip in accordance with the read command,
wherein the flash memory controller is configured to:
hold a read pattern defining an order of selection of a plurality of read options each specifying a respective parameter value for reading the data from the flash memory chip,
execute error correction on the data, read from the flash memory chip in accordance with the read command, in units of code words,
designate a next read option specified in the read pattern to read the data from the flash memory chip when all errors in the read data are not corrected by the error correction,
hold the data read from the flash memory chip with different read options, and
merge user data of corrected code words in the data which have been read with different read options to create fully corrected data for the read command.

8. A flash memory device comprising:
a flash memory chip configured to store data;
a processor configured to interpret a read request from an external device and create a read command; and
a flash memory controller configured to receive the read command from the processor and read the data from the flash memory chip in accordance with the read command,
wherein the flash memory controller is configured to:
hold a read pattern defining an order of selection of a plurality of read options each specifying a respective parameter value for reading the data from the flash memory chip,
execute error correction on the data, read from the flash memory chip in accordance with the read command, in units of code words,
designate a next read option specified in the read pattern to read the data from the flash memory chip when all errors in the read data are not corrected by the error correction, and
wherein the processor is configured to merge user data of corrected code words in the data which have been read with different read options to create read data for the read request.

9. The flash memory device according to claim 1,
wherein the flash memory controller is configured to read the data from the flash memory chip in units of pages, and
wherein the predetermined units are code words of one of the pages.

10. The flash memory device according to claim 7,
wherein the flash memory controller is configured to read the data from the flash memory chip in units of pages.

11. The flash memory device according to claim 7,
wherein the flash memory controller is configured to hold a plurality of read patterns,
wherein the processor is configured to designate a read pattern to be used by the flash memory controller from the plurality of read patterns, and wherein the flash memory controller is configured to refer to the designated read pattern to read the data from the flash memory chip in accordance with the read command.

12. The flash memory device according to claim 11, wherein the processor is configured to determine the read pattern to be designated for the flash memory controller based on a wear level of an area to be accessed in the flash memory chip in accordance with the read command.

13. The flash memory device according to claim 8, wherein the flash memory controller is configured to read the data from the flash memory chip in units of pages.

14. The flash memory device according to claim 8, wherein the flash memory controller is configured to hold a plurality of read patterns, wherein the processor is configured to designate a read pattern to be used by the flash memory controller from the plurality of read patterns, and wherein the flash memory controller is configured to refer to the designated read pattern to read the data from the flash memory chip in accordance with the read command.

15. The flash memory device according to claim 14, wherein the processor is configured to determine the read pattern to be designated for the flash memory controller based on a wear level of an area to be accessed in the flash memory chip in accordance with the read command.

* * * * *